US009543067B2

United States Patent
Acuna et al.

(10) Patent No.: US 9,543,067 B2
(45) Date of Patent: Jan. 10, 2017

(54) MAGNETIC PRE-CONDITIONING OF MAGNETIC SENSORS

(71) Applicants: Carlos M. Acuna, Tempe, AZ (US); Mohammad A. Faruque, Chandler, AZ (US); Kevin R. Fugate, Madison, MS (US); Todd D. Hoffmann, Mesa, AZ (US); Paige M. Holm, Phoenix, AZ (US); Peter T. Jones, Scottsdale, AZ (US); Rigoberto Lopez, Jr., Chandler, AZ (US); William D. McWhorter, Goodyear, AZ (US)

(72) Inventors: Carlos M. Acuna, Tempe, AZ (US); Mohammad A. Faruque, Chandler, AZ (US); Kevin R. Fugate, Madison, MS (US); Todd D. Hoffmann, Mesa, AZ (US); Paige M. Holm, Phoenix, AZ (US); Peter T. Jones, Scottsdale, AZ (US); Rigoberto Lopez, Jr., Chandler, AZ (US); William D. McWhorter, Goodyear, AZ (US)

(73) Assignee: NXP USA, INC., Austin, TX (US)

( * ) Notice: Subject to any disclaimer, the term of this patent is extended or adjusted under 35 U.S.C. 154(b) by 29 days.

(21) Appl. No.: 14/135,956

(22) Filed: Dec. 20, 2013

(65) Prior Publication Data
US 2015/0179325 A1   Jun. 25, 2015

(51) Int. Cl.
*G01R 31/315* (2006.01)
*H01F 7/02* (2006.01)
*G01R 1/04* (2006.01)

(52) U.S. Cl.
CPC ........... *H01F 7/0294* (2013.01); *G01R 1/0408* (2013.01); *G01R 31/315* (2013.01)

(58) Field of Classification Search
CPC ......... B82Y 25/00; B82Y 40/00; G01D 5/145; G01R 33/09; G01R 33/04; H01L 43/08; H01L 27/222; G01P 3/487
USPC ......................................................... 324/750
IPC ..................................................... G01P 3/487
See application file for complete search history.

(56) References Cited

U.S. PATENT DOCUMENTS

| | | | |
|---|---|---|---|
| 3,641,519 A * | 2/1972 | Ashley .......................... | 365/205 |
| 5,617,289 A * | 4/1997 | Abboud et al. ............... | 361/151 |
| 5,729,410 A | 3/1998 | Fontana, Jr. et al. | |
| 5,865,319 A | 2/1999 | Okuda et al. | |
| 5,898,547 A | 4/1999 | Fontana, Jr. et al. | |
| 7,541,804 B2 | 6/2009 | Chung et al. | |
| 8,294,481 B2 | 10/2012 | Akahoshi et al. | |

(Continued)

OTHER PUBLICATIONS

Printout of SRM model XD248 Ic Handler product page from http://www.srm.com.my. Copyright 2008, retrieved on Dec. 18, 2013.

*Primary Examiner* — Son Le
*Assistant Examiner* — Akm Zakaria

(57) ABSTRACT

Methods, systems and apparatus are provided to apply a magnetic pre-conditioning to magnetic tunneling junction (MTJ) sensors and other micro-magnetic devices after fabrication but before testing, trimming or other subsequent processing. The fabricated sensor device is passed through a magnetic field that has a known direction and orientation relative to the device so that the device is placed into a known state prior to final testing and trimming. Various embodiments allow the field to be applied in situ by a permanent magnet or electromagnet as the devices are being processed by a conventional device handler or similar processing system.

18 Claims, 6 Drawing Sheets

(56) References Cited

U.S. PATENT DOCUMENTS

| | | | |
|---|---|---|---|
| 2002/0130659 A1* | 9/2002 | Wincheski et al. | 324/235 |
| 2003/0206361 A1* | 11/2003 | Baril et al. | 360/66 |
| 2011/0102116 A1* | 5/2011 | Biskeborn et al. | 335/302 |
| 2012/0249172 A1* | 10/2012 | Cameron | 324/750.16 |
| 2013/0106410 A1* | 5/2013 | Liu et al. | 324/246 |
| 2013/0169271 A1* | 7/2013 | Nordman et al. | 324/222 |
| 2015/0028863 A1* | 1/2015 | Zeyen | G01R 33/0052 324/244 |

* cited by examiner

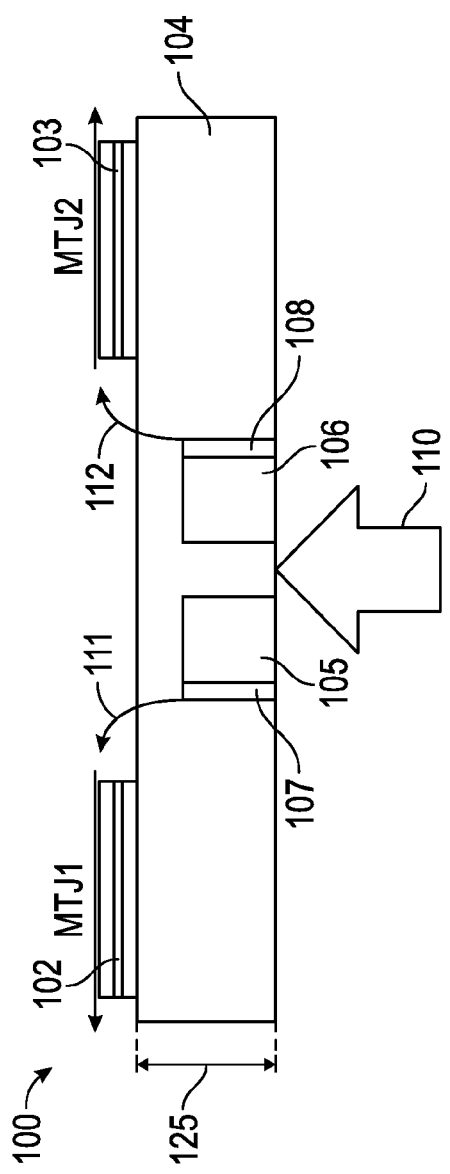
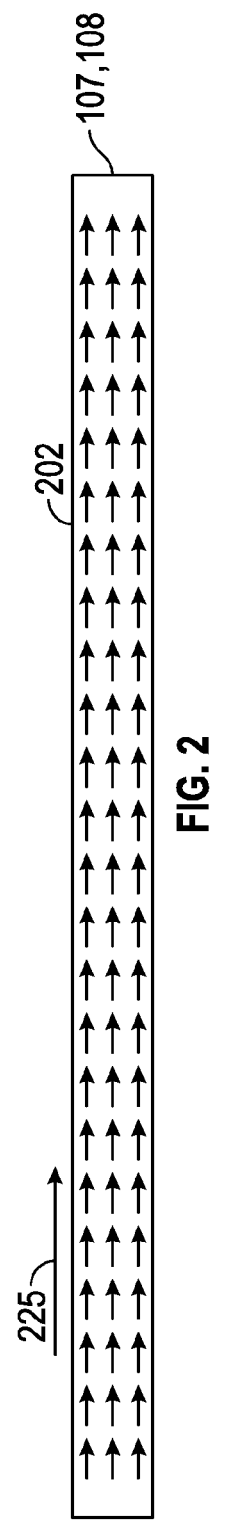
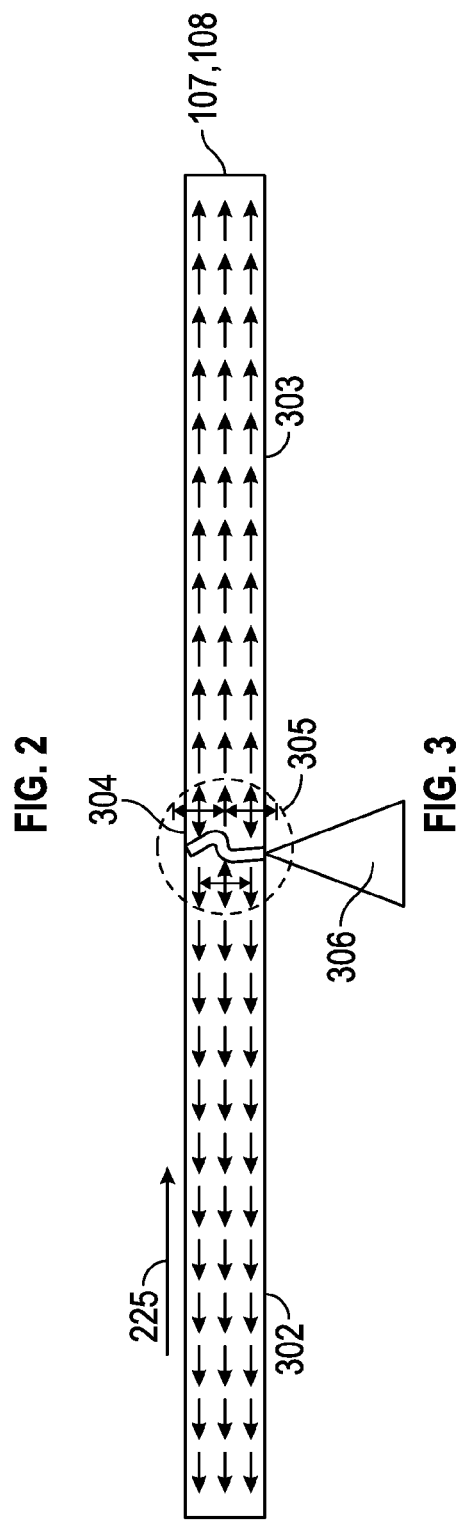
FIG. 1
FIG. 2
FIG. 3

MAGNETIC PRE-CONDITIONING OF MAGNETIC SENSORS

TECHNICAL FIELD

Embodiments of the subject matter described herein relate generally to magnetic tunnel junction (MTJ) or other micro-magnetic sensors, and more particularly to methods, devices, and systems used in the magnetic pre-conditioning of flux guides used in MTJ or other micro-magnetic sensors.

BACKGROUND

Micro-magnetic sensors are used to detect magnetic fields. Magnetic tunnel junction (MTJ) sensors, for example, detect the presence of magnetic fields using tunnel magnetoresistance (TMR) effects. Such sensors are becoming more commonly used in magnetic read heads, electrical current sensors, magnetometers, electronic compasses, magnetic random access memory (MRAM) and many other settings.

MTJ and other magnetic sensors are generally manufactured on silicon or other substrates using conventional micro-electronic manufacturing techniques. A typical MTJ sensor includes at least two layers of ferromagnetic material separated by a thin insulating tunnel barrier that allows electrons to tunnel between the ferromagnetic layers using quantum mechanical effects. It can be a continual challenge to improve the performance and stability of such sensors.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

FIG. 1 is a diagram of an exemplary sensor that includes multiple magnetic tunneling junctions and associated flux guides;

FIG. 2 is a diagram of an exemplary flux guide in a more ideal normal state;

FIG. 3 is a diagram of an exemplary flux guide in a more unstable state due to the application of an undesired magnetic field;

DETAILED DESCRIPTION

Figure 4:
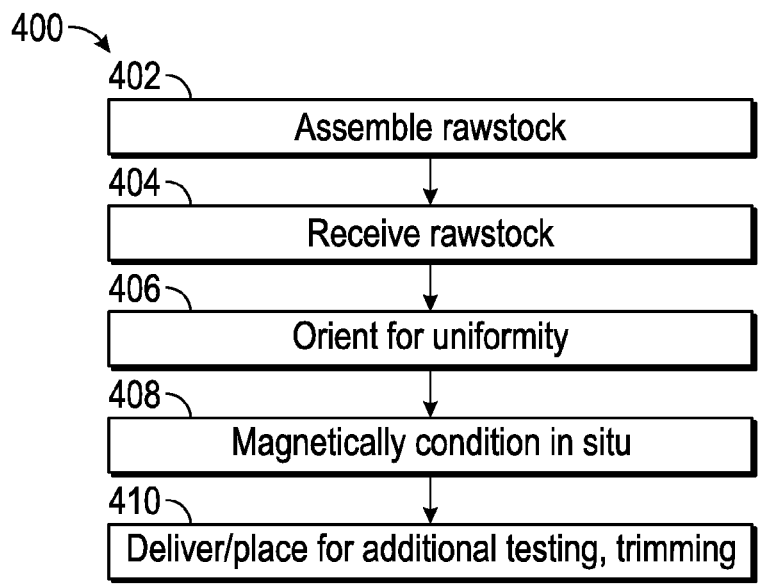
FIG. 4 is a flowchart of an exemplary process for in situ pre-conditioning of MTJ sensors after manufacture but prior to testing.

The following detailed description is merely illustrative in nature and is not intended to limit the embodiments of the subject matter or the application and uses of such embodiments. Any implementation described herein as "exemplary" is intended as an example, and not necessarily as a model to be construed as preferred or advantageous over other implementations. Furthermore, there is no intention to be bound by any expressed or implied theory presented in the preceding technical field, background, or the following detailed description.

It can be highly desirable to pre-condition the magnetic states of sensor flux guides prior to final testing to ensure stable sensor response and accurate calibration and trim of the device. Various embodiments of the subject matter described herein therefore relate to pre-conditioning of micro-magnetic sensors prior to final testing or trimming by exposing the devices to a magnetic field of known orientation and magnitude. By applying a field of sufficient magnitude along the long axes of the flux guides of the sensor, spurious magnetic effects can be reduced or eliminated, thereby improving sensor responsiveness. Further, the magnetic cleansing can be applied in situ after fabrication but prior to testing to thereby place the newly-fabricated sensors into a known initial state. In situ conditioning may be performed by simply passing the sensor through a magnetic field applied along the path of the device as it is processed by an integrated circuitry (IC) handler or similar device. Additional details of various devices, systems and techniques for magnetic pre-conditioning are described in additional detail below.

Turning now to the drawing figures and with initial reference to FIG. 1, an exemplary micro-magnetic sensor 100 suitably includes one or more magnetic tunneling junctions or other magnetic sensing elements 102, 103 formed on a silicon or other appropriate substrate 104. In various embodiments, one or more flux guides 107, 108 are formed in the substrate and oriented to direct magnetic flux from an applied magnetic field 110 toward the sensitive portions of sensing elements 102, 103. In a conventional MTJ sensor 100, each sensing element 102, 103 typically includes two or more layers of ferromagnetic material separated by a thin layer of an insulating material to provoke tunneling effects in the presence of an applied electrical bias and an appropriate magnetic field 110. To that end, the exemplary sensor 100 illustrated in FIG. 1 could be used to sense magnetic fields no applied in a single direction 125. In this example, the long axes of flux guides 107, 108 are generally oriented to be parallel to each other and perpendicular to the sensed dimension 125 to maximize the flux 111, 112 provided to the sensing elements 102, 103. Other embodiments could provide additional MTJs and/or other sensing elements 102, 103 to sense fields no applied in two or more dimensions, as desired.

Flux guides 107, 108 are typically formed of ferromagnetic material, and may be fabricated along the sidewalls of conductors 105 and/or 106 as desired. In some embodiments, the flux guides 107, 108 are formed to be on the order of one micron thick and approximately 200 microns in length, although other dimensions could be equivalently used. Flux guides 107, 108 are typically made of relatively high permeability material, such as nickel-iron (NiFe) or the like.

Magnetic materials exhibit regions of uniform magnetization called "magnetic domains". Under ideal conditions, each flux guide 107, 108 supports a single region 202 wherein all of the magnetic domains are aligned, as illustrated in FIG. 2. In this example, all of the magnetic domains are substantially aligned to be consistent across the entire long axis of the guide (i.e., along direction 225 in FIG. 2).

In this state, the magnetic domains in flux guide 107, 108 are essentially aligned along the long axis 225 of the flux guide 107, 108.

After initial fabrication, the domains in guides 107, 108 may be more or less randomly oriented; at the very least, the domains will not be expected to be in alignment until the guides are exposed to pre-setting magnetic fields. Further, certain conditions can produce rogue states in which the domains in flux guides 107, 108 are not aligned, thereby noticeably degrading the performance of sensor 100. In particular, the relatively pointed tips existing on many of the magnetically-conductive tools used within conventional device assembly and testing environments can produce undesirable ferromagnetic effects in flux guides 107, 108. A conventional IC ejector pin, for example, typically has a radius tip of about 20 microns or so that can produce undesirable ferromagnetic effects in flux guides 107, 108.

Fields emanating from sharp points 306 of magnetic or ferromagnetic materials that are external to the sensor 100 can produce domain walls 304 that separate differently-aligned regions 302, 303 within the guide 107, 108, as illustrated in FIG. 3. In this example, diverging or converging fields of sufficient strength and localization can produce regions 302, 303 within the flux guide 107, 108 where the magnetic domains are aligned in different directions. The region 305 surrounding domain wall 304 has been observed to be unstable over time as domains close to the wall 304 may spontaneously change their directions to align with the magnetic fields in one domain 302 or another 303, thereby producing elevated noise levels that can degrade the performance of sensor 100. Moreover, the domain wall 304 has been observed to change its position within guide 107, 108 in response to applied fields, thereby resulting in undesirable drifting or shifting in the sensor offset. These changes in the sensor offset have been observed in response to applied fields on the order of about ten Gauss or so, which could overlap the operating window of certain types of sensors.

According to an embodiment, a sufficiently strong magnetic field along the long axes 225 of the flux guides 107, 108, however, can force the domain boundary 304 out the end of the guide 107,108, thus purging the guide of this rogue state and restoring stable response in sensor 100. A field on the order of about 100 gauss or so, for example, has been found to remove the spurious effects caused by pin sources or the like. The particular magnitude will vary from embodiment to embodiment dependent upon the makeup of the sensor 100 and any number of other factors; equivalent embodiments may apply fields greater than about 75 Gauss or so, or any other magnitude as appropriate for the particular sensor 100. It is not necessary that the conditioning field be applied directly along the long axis 225 of the flux guide 107, 108 if the field a component along the long axis 225 that has sufficient strength to remove the spurious effects (e.g., domain wall 304). In a two-dimensional sensor that detects fields along two orthogonal axes, for example, a single field applied at a 45 degree angle between the two axes may be sufficiently strong to simultaneously condition flux guides oriented along both sensing directions, provided that the applied field has sufficient magnitude. Alternately, a single magnet or yoke orientation could be used to process different types of single axis sensors having varying orientations, provided that the applied field is sufficiently strong to produce components of magnetic fields in each of the relevant orientations. Additional discussion of applying a conditioning field in a multi-axis sensor is provided below in conjunction with FIG. 9.

The conditioning magnetic field may be applied to the sensor device 100 in any manner. In various embodiments, a permanent magnet, electromagnet and/or magnet assembly is provided to generate a sufficiently strong magnetic field in a direction of interest. Sensor device 100 and/or the magnetic field source are moved relative to each other to generate the appropriate conditioning field. Although the following discussion focuses primarily upon moving the fabricated device 100 relative to a stationary magnetic field, equivalent embodiments could instead maintain the device 100 in a stationary position and move the magnetic field, or both the device 100 and the field could be moved relative to each other.

FIG. 4 shows an exemplary process 400 to pre-condition a MTJ sensor or similar device 100. Process 400 may be executed by any sort of test or assembly machinery, including any sort of integrated circuit (IC) handler system or the like. Conventional hander systems typically include bins or trays for receiving fabricated devices 100, any number of assembly/test or other processing stations, and one or more moveable arms or other members for transporting devices 100 between stations. A pick-and-place arm of a conventional hander system, for example, could be used to move devices 100 as described herein. Handler systems typically operate under the direction and control of software or firmware that executes in a microprocessor, microcontroller or other processing circuit, and that is stored within a memory, disk drive or other non-transitory storage within the handler system. Handler systems may also include machine vision or other subsystems as well as video displays or other features for interacting with a human operator, as desired. One example of a hander system that could be used is the SRM model XD248 handler available from SRM Integration of Penang, Malaysia, although many other hander systems or the like could be equivalently used.

Process 400 as illustrated in FIG. 4 involves fabricating or otherwise assembling the sensor devices 100 (function 402), referred to as "fabricated sensor devices" or "rawstock", receiving the fabricated sensor devices 100 at the handling system (function 404), orienting the sensor devices 100 for uniformity (function 406), exposing the aligned sensor devices 100 to a magnetic field for in situ conditioning (function 408), and then delivering the conditioned sensor devices 100 for further testing, trimming, packaging or other processing (function 410). As noted above, each of these functions 402-410 could be performed by an IC handler system under the control of a microprocessor or other controller executing appropriate software or firmware, as appropriate.

Magnetic conditioning may be most beneficial when it is performed after device assembly (function 402). When the devices 100 are fabricated and assembled, point sources (or other sources) of magnetic or ferromagnetic fields may be present, and these sources could induce undesired magnetic effects, such as the domain wall 304 discussed above.

After the devices 100 are assembled, then, the fabricated raw stock can be received at the handler or other processing system (function 404). In various embodiments, the hander system has a bowl-type input that is capable of receiving raw stock devices 100 for further processing. In many handler systems, a "pick-and-place" arm or other moveable member retrieves individual devices 100 from the input bowl and moves the various devices through different sites for testing or other processing.

In many implementations, it is desirable to ensure that the devices being processed are properly oriented (function 406) so sufficient conditioning flux can be applied in the relevant direction. A machine-vision feature of the handler system, for example, could recognize the raw stock devices 100 and rotate (or otherwise actuate) the moveable member so that the device 100 is properly oriented for further processing. In many cases, orientation would be performed prior to testing (e.g., to ensure proper pin placement in a test socket), so additional orientation for pre-conditioning may not be needed.

As noted above, preconditioning typically involves placing the device 100 in an externally-applied magnetic field having a sufficient magnitude parallel to the long axis of the flux guides 107, 108 to remove any domain walls 304 or other undesirable magnetic effects. Typically, then, it will be beneficial to properly orient the device 100 relative to the magnetic field to ensure sufficient magnetic flux in the direction of interest. Note that the magnetic field need not be perfectly aligned with the long axis of the flux guides 107, 108 so long as the applied field has sufficient magnitude along the long axis to remove the undesired magnetic effects.

In various embodiments, devices 100 are magnetically conditioned as they are moved within the handler system (function 408), such as when the device is moved between test sites of the handler, from the input bowl to a first test site, and/or otherwise. Some implementations apply a conditioning magnetic field along the path of the hander's moveable member using one or more electromagnets, permanent magnets and/or the like so that the devices 100 are automatically exposed to the conditioning field as they are moved from site to site. In other implementations, the conditioning field may be applied while the device 100 resides at a stationary test site, or in any other manner. Various embodiments therefore provide in situ magnetic pre-conditioning of the fabricated devices 100 (function 408) in the sense that device 100 is placed in a conditioning field prior to the device being tested, trimmed, handled or otherwise processed. Various structures and assemblies for providing in situ magnetic conditioning are described below.

After conditioning, the conditioned devices 100 may be tested, trimmed, packaged, and/or otherwise processed as desired (function 410). In various embodiments, the moveable member of the hander system delivers the conditioned devices 100 to a test site or the like for further processing.

Figure 5:
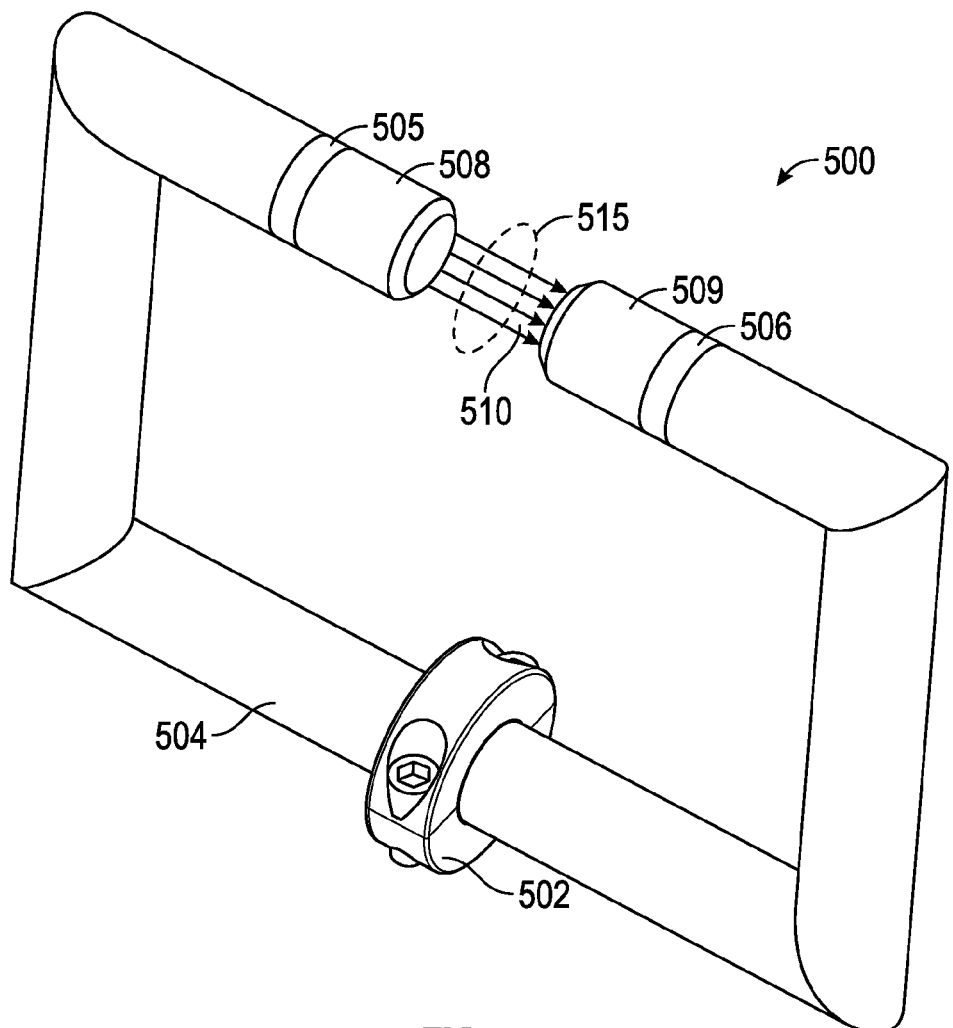
FIG. 5 is a diagram of an exemplary yoke that could be used to apply an in situ conditioning field to MTJ sensors.

FIG. 5 shows one example of a magnetic yoke assembly 500 that could be used to provide an in situ conditioning field 510 to a conditioned device 100. Although this example shows a two-magnet yoke 500, other types of magnetic yokes 500 could include one magnet (see FIGS. 10-11, described below), or any number of additional magnets as desired. Yokes of many different but equivalent orientations, shapes and structures could also be formulated.

Referring now to FIG. 5, the illustrated assembly 500 suitably includes a crosspiece member 504, two permanent magnets 505, 506, and two extender members 508, 509 as appropriate. Crosspiece member 504 is shown to be substantially "C" shaped in that the two opposite ends of the member 504 (i.e., ends proximate magnets 505, 506) are facing each other, thereby allowing for closer placement of the two magnets 505, 506. The higher permeability of the materials of the C-shaped yoke structure suitably provides an effective return path for the magnetic flux and helps to reduce strong magnetic fields that might otherwise adversely impact results at adjacent test sites. In various embodiments, crosspiece member 504 and extender members 508, 509 are formulated from steel such as 1018 steel or the like, although any material with a relative permeability greater than one could be used in alternate implementations. Although members 504, 508 and 509 are shown to be formed of the same material in FIG. 5, other embodiments could use members 504, 508, 509 formed from different materials and/or shaped in any other manner, as desired. The various members 504, 508, 509 and magnets 505, 506 may be joined together using an appropriate adhesive, or the like. Alternatively, the components of yoke 500 could be held together through magnetic attraction generated by magnets 505, 506.

Magnets 505, 506 are shown to be permanent magnets made from any magnetic or ferromagnetic material, such as alnico (e.g., alnico 8), rare earth magnets, and/or the like. The yoke assembly 500 is designed to produce a magnetic field 510 having an appropriate magnitude and direction so that devices 100 passing through the gap region 515 will be conditioned as described herein. Alternatively, magnetic field 510 could be produced with an electromagnet, as desired. Electromagnets may be particularly beneficial if it is necessary (or at least desirable) to discontinue the magnetic field 510 at certain times, or for processing devices 100 that do not need to be magnetically conditioned without removing the yoke assembly 500 from the processing path.

Yoke 500 may be designed to have any dimensions to accommodate devices 100 of various sizes and shapes. In an exemplary embodiment for processing certain types of sensors 100, the yoke is approximately 19-20 millimeters (mm) in diameter, approximately 176 mm in width, and approximately 136 mm in height, although other embodiments may be made larger or smaller, as desired. This example yoke 500 is also designed to have a gap 515 between extender members 508, 509 of approximately 28 mm so that properly oriented devices 100 have adequate room to pass through, although again other embodiments may have different dimensions. In various embodiments, extender members 508, 509 may be swappable with other extender members of different lengths to create gaps 515 of different sizes to accommodate differently sized or differently oriented devices 100, to adjust the intensity of magnetic field 510, and/or for any other purpose. Extender members 508, 509 are illustrated in FIG. 5 to have a beveled edge facing toward the gap 515 to "focus" the magnetic field 510 and potentially reduce any undesired effects of the field 510 on areas outside of gap 515.

The example yoke 500 shown in FIG. 5 also includes a clamp-type mount 502 for affixing the yoke 500 to a handler system or other processing machine for in situ conditioning. Mount 502 allows the yoke 500 to be rigidly mounted to the handler so that the magnetic field 510 remains relatively stationary with respect to the machine. Mounts of any sort could be used in other embodiments.

Figure 6:
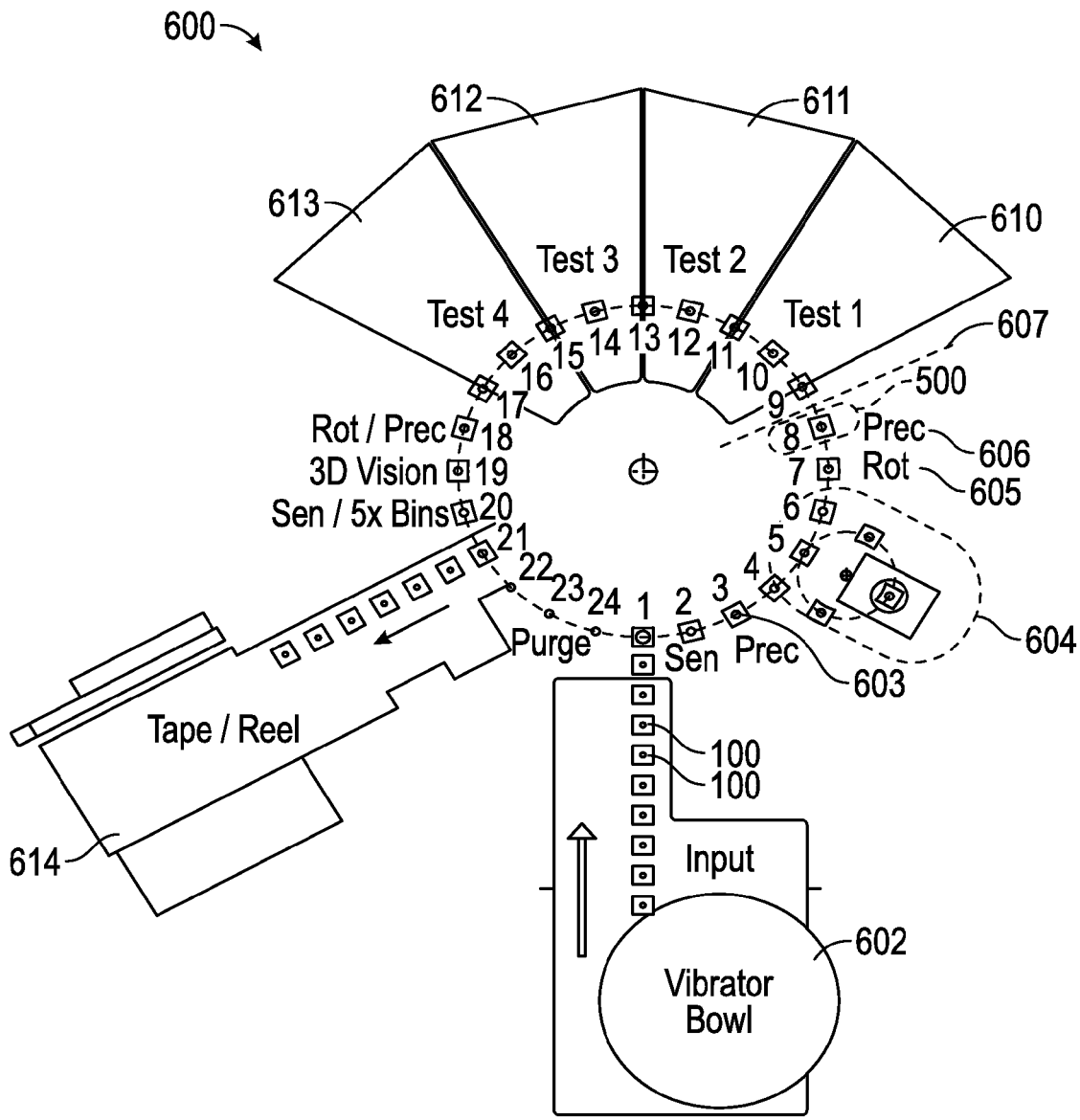
FIG. 6 is a diagram of an exemplary integrated circuit handler that includes an in situ pre-conditioning magnetic field.

FIG. 6 shows an example of the yoke assembly 500 rigidly mounted to a hander system 600 for applying in situ magnetic conditioning. In the illustrated embodiment, a moveable member 603 obtains raw stock devices 100 from the input bowl 602 (e.g., a vibrator bowl), allows for alignment of the devices 100 using machine vision 604 or the like, and then moves the devices 100 along a processing path to one or more test sites 610-613. In various embodiments, the moveable member 603 is a turret or similar structure of the handler 600 that simultaneously moves multiple devices 100 throughout the various stations of the handler 600. The turret typically includes a lifter or the like that lowers devices 100 at appropriate times for testing, and that raises the devices 100 for transport between test sites. Other embodiments could implement moveable member 603 with a pick-and-place arm, or with any other structure capable of moving one or more devices 100 within handler system 600.

In various embodiments, the devices 100 receive the conditioning field 510 in situ while moveable member 603 moves the device 100. For example, devices 100 may pass through the gap region 515 of yoke 500 as the hander 100 moves the devices toward test site 610. In this example, the conditioning field is applied as the devices 100 pass through the normal handling path after manufacturing but before testing or trimming, as appropriate. Equivalent embodiments could apply a similar magnetic conditioning by exposing a fabricated device 100 to a conditioning magnetic field 510 that is aligned relative to the device 100 as appropriate. Although in situ conditioning is not required, providing an in situ conditioning as part of the testing and handling process may be convenient for many applications.

In the example shown in FIG. 6, a serial stream of fabricated sensor devices 100 are provided from the input bowl 602 for transport through the handler 600 by moveable member 603. FIG. 6 shows the path of moveable member 603 as moving the devices 100 along a generally circular path (designated as points 1-24) that encompasses alignment and precising, in situ magnetic pre-conditioning and any number of test sites 610-613 prior to delivery to an output stage 614. The output stage 614 in this example is a tape/reel type output; other embodiments could equivalently provide magnetic pre-conditioning along a linear, elliptical or other test path, and could provide finished devices 100 in any manner.

After each device 100 is accepted by a moveable member 603, the device is properly aligned to ensure that the conditioning field 510 is applied in the proper direction and that the device 100 is properly placed in sockets or other receptacles at testing sites 610-613. In many embodiments, the magnetic yoke 500 or other field-providing structure can be properly placed and oriented along the conventional path of the handler so that additional device alignment is not necessary. Examples of such placement are described more fully below.

In the example of FIG. 6, machine vision system 604 suitably identifies the orientation of each device 100 as it is received from the input bowl 602. By identifying a mark, pin, or other feature of the device 100, the current orientation of each device 100 at station 604 can be identified. This information can be used to direct a rotator 605 ("Rot") to rotate the device 100 as needed to properly align the device for pre-conditioning and subsequent testing.

A precisor 606 ("Prec") may also be provided to more finely position and orient the device 100 prior to testing. In various embodiments, the moveable member 603 drops each device 100 from an elevated movement level into the precisor 606 for proper positioning. After the device 100 has been placed in the precisor 606, it is typically mechanically positioned and oriented for testing. It can therefore be beneficial to apply conditioning field 510 in the vicinity of precisor 606, since this is typically one of the last stages that the devices 100 pass through prior to actual testing or trimming.

In the example of FIG. 6, a C-shaped magnetic yoke 500 is placed along the path of the moveable member 603 near the precisor 606 (e.g., near point 8 of FIG. 6). As devices 100 pass through the gap 515 in magnetic yoke 500, they receive the conditioning field 510 as desired. It may be beneficial, in some implementations, to shield test sites 610-614 from the effects of magnetic yoke 500. To that end, a shield 607 may be provided to block magnetic effects from field 510. Shield 607 may be implemented with any sort of MU metal or other appropriately-conductive material, as desired. Additional detail about the movement of devices 100 through the handler boo is provided in FIGS. 7-9 below.

The conditioning field 510 could be equivalently applied in any number of ways other than the manner shown in FIG. 6, using any sort of magnetic yoke or other field generation structure. In some embodiments (see FIGS. 10-11, described below), a magnetic field 510 may be created with a yoke 550 (FIG. 10) that could be bolted or otherwise affixed directly to the precisor 606. As the devices 100 are dropped into the precisor 606, then, they would receive the conditioning field 510 at the same time. Again, any number of equivalent embodiments to apply an in situ pre-conditioning field could be formulated.

Figure 7:
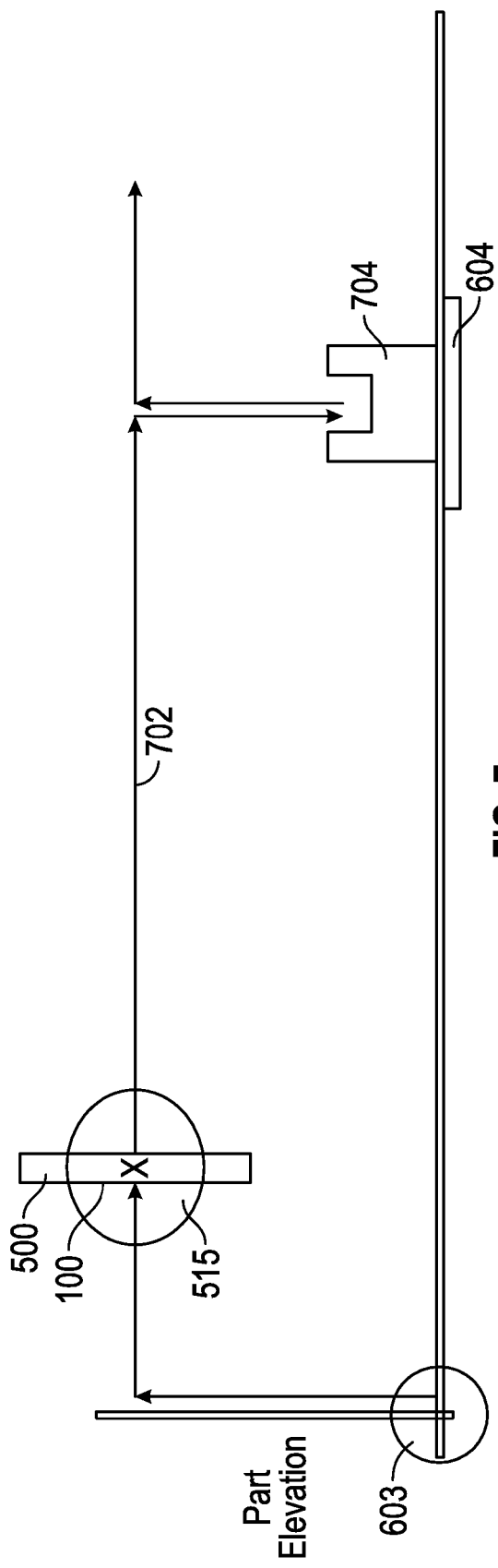
FIG. 7 is a side view diagram showing exemplary movement of an exemplary MTJ sensor during in situ pre-conditioning.
Figure 8:
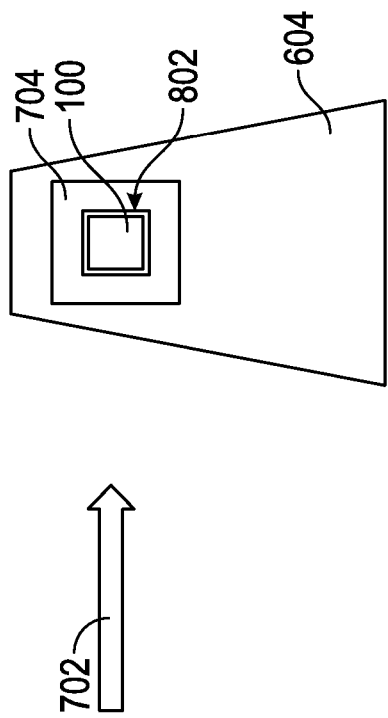
FIG. 8 is a top view diagram showing exemplary movement of an exemplary MTJ sensor during in situ pre-conditioning.

FIGS. 7 and 8 illustrate side and top views, respectively, of an exemplary path 702 that could be used to provide in situ conditioning according to the embodiment of FIG. 6. Path 702 represents the path taken by devices 100 as they are moved by moveable member 603 or another actuating member of handler system 600.

As best seen in FIG. 7, the device 100 is initially moved from the supply bowl or other receiving area 602 for transport to test site 704. In various embodiments, this involves lifting the device 100 from the supply station 602 by the moveable member 603 of hander 600. While the device 100 is moved toward the test site 604, it is appropriately oriented as needed and passed through a conditioning field 510. In the example of FIG. 7, the conditioning field is applied in the gap region 515 of a yoke 500 or the like while the device passes through the gap 515. After conditioning, the device 100 may be placed into a socket 704 or other receptacle at the test station 610 for further processing. In many types of handler systems 600, the moveable member 603 drops the device 100 into the socket 704 for processing, as appropriate.

In the top down view of FIG. 8, the orientation of device 100 can be seen to remain consistent throughout the travel on path 702. Location 802, for example, could indicate a particular pin or other point of reference on the device 100 that can be used to orient the device 100 for placement in a test socket 704, as well as for in situ magnetic conditioning. That is, since the orientation of device 100 is typically known or otherwise set for testing purposes, this known orientation can be used to also set the orientation of the magnetic field 510 applied by yoke 500 or the like.

Figure 9:
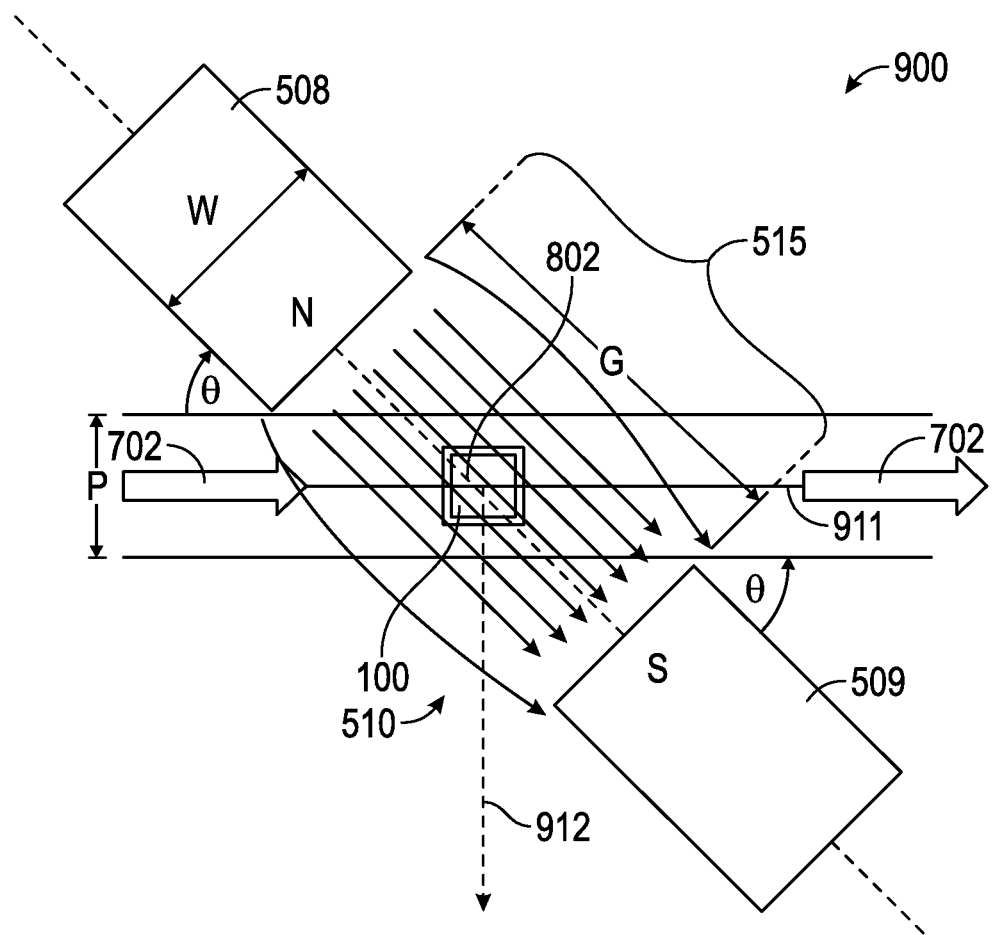
FIG. 9 is a more detailed top view diagram showing movement of an exemplary MTJ sensor through the exemplary pre-conditioning yoke of FIG. 5.

FIG. 9, for example, shows a more detailed top-down view 900 of the gap region 515 of yoke 500. In this example, device 100 has flux guides 107, 108 aligned along axis 911 or axis 912. As the device 100 moves through gap 515 along path 702, magnetic field 510 conditions the flux guides 107, 108 as needed to remove unwanted magnetic effects. Note that in this example, field 510 is applied at a 45 degree angle to both axis 911 and axis 912, thereby producing components of the field 510 that have magnitudes (M) depending upon the particular angle ($\theta$) between the field 510 and the path of travel 702. Through application of simple trigonometry, the components of field 510 applied along axes 911 and 912 will be reduced according to the cosine and sine of angle $\theta$, respectively. In particular, if the field 510 is applied at a 45 degree angle (i.e., approximately midway between both axes 911, 912), then the component of the field 510 applied along each axis would have approximately 70% (i.e., 1/sqrt (2)) of the total field strength. A field 510 of approximately 140 Gauss, for example, would produce effective field components of about 100 Gauss along both axes 911 and 912, and could therefore be used to condition flux guides 107, 108 oriented in either direction. A relatively fixed, stationary yoke assembly 500 may therefore nevertheless be used to in situ condition devices 100 having different orientations and/or devices 100 that provide sensitivity in multiple directions.

Figure 10:
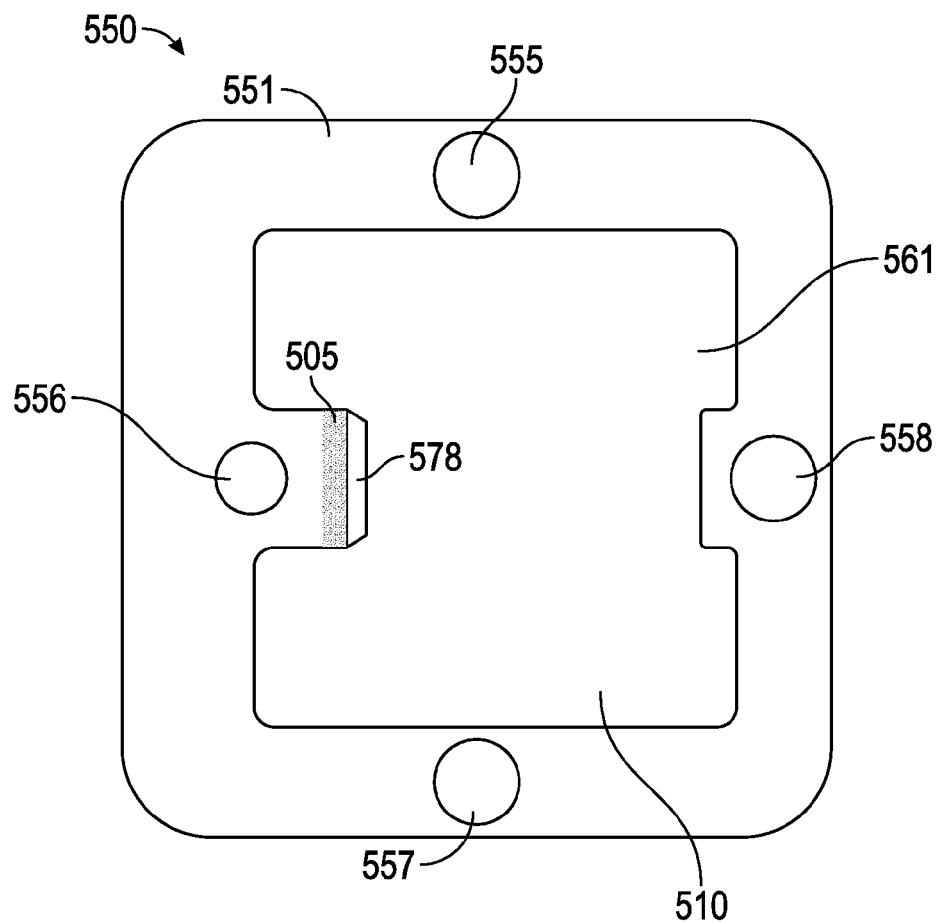
FIGS. 10-11 are top and perspective views, respectively, of an alternate embodiment of a magnetic yoke.
Figure 11:
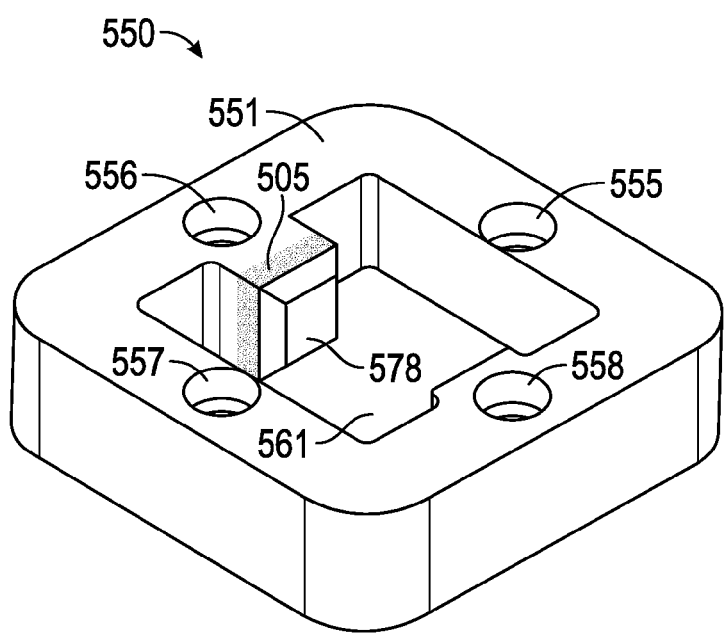

FIGS. 10 and 11 show top and perspective views, respectively, of an alternate magnetic yoke 550 that has a single magnet 505. In this example, the conditioning field 510 is applied within a gap 561 that is large enough to accept the properly aligned sensor 100. The example yoke 550 shown in FIGS. 10 and 11 includes holes 555-558 that accept bolts or the like for rigid attachment next to the precisor 606 or socket 704. To adjust the orientation of the applied field 510 for different products having different flux guide orientations, the fasteners in holes 555-558 could simply be removed and yoke 550 could be rotated or otherwise repositioned as desired. By rotating the yoke 550 to apply the field 510 in a desired and configurable direction (e.g., to align with the long axis 225 of flux guides 107, 108), it may be possible to use a less powerful magnetic field 510 than would otherwise be needed, thereby reducing any spurious magnetic effects that would otherwise be applied at nearby test sites.

Yoke 550 as illustrated in FIGS. 10-11 could be conveniently bolted or otherwise affixed next to a precisor 606 or to any other suitable location along the path of handler 600 so that the devices 100 receive the in situ conditioning without other adjustment to the handler path. Other embodiments could locate yoke 550 at virtually any position along the handler path so that an in situ conditioning magnetic field is applied after rotation/alignment of the device 100, but before actual testing. Still other embodiments may provide the conditioning field in any other location or manner, including an ex situ conditioning applied after fabrication but prior to testing or trimming of the device 100.

The example yoke 550 illustrated in FIGS. 10-11 includes a generally square-shaped member 551 that is generally equivalent to the crosspiece member 504 described above, in that it is formed of steel or another material of suitable permeability and in that it supports magnet 505 and/or extender member 578. The single magnet 505 is shown as an Alnico or other permanent magnet, but an electromagnet could be used in an equivalent implementation. Extender member 578 (like extender member 508 above) may be provided to further "focus" the magnetic field 510 applied to the device 100 being conditioned. In various embodiments, extender member 578 includes beveling or the like to reduce spurious magnetic effects at test sites or in locations other than the region 515 where the field 510 is intended to be applied. Many different types of yokes 500, 550 could be equivalently formed to accommodate different types of devices 100, handlers 600 and/or manufacturing and testing environments. Such yokes may include any number of magnets, as well as crosspiece and/or other support structures to facilitate mounting to the hander 60o and application of field 510 to devices 100 as appropriate.

To briefly summarize, one advantage of the subject matter described above is that undesired magnetic effects (such as those emanating from sharp tips of ferromagnetic objects) can be eliminated prior to testing or trimming of a micro-magnetic sensor or similar device by applying a conditioning magnetic field along the long axes of the flux guides. For the sake of brevity, conventional techniques related to sensor design or operation, IC device manufacturing and/or the like may not be described in detail herein. These techniques will nevertheless be appreciated by those of skill in the relevant art. In addition, certain terminology used herein is intended for the purpose of reference only without any intent to limit the scope of the described subject matter. For example, the terms "first", "second" and other such numerical terms referring to physical structures are intended for reference, but are not intended to imply a sequence or order unless clearly indicated by the context. As noted at the outset, the word "exemplary" means "serving as an example, instance, or illustration" rather than as a model or template that must be literally duplicated.

In conclusion, systems, devices, and methods configured in accordance with example embodiments of the invention relate to methods, handler systems and/or magnetic yoke apparatus for applying conditioning magnetic fields to micro-magnetic sensors.

In a first embodiment, a method is executable by a handler apparatus to process a sensor device comprising a magnetic sensing element and a flux guide aligned to direct magnetic flux toward the magnetic sensing element. The method suitably comprises receiving the sensor device after fabrication of the sensor device, exposing the fabricated sensor device to a magnetic field having a component aligned along a long axis of the flux guide, the component having a magnitude along the long axis of the flux guide sufficient to place the flux guide into a known magnetic state, and, after passing the fabricated sensor device through the magnetic field, providing the sensor device for subsequent testing of the device.

The above embodiment may be additionally refined in that the component of the magnetic field places the flux guide into a known magnetic state by making the alignment of the magnetic domains uniform along substantially the entire long axis of the flux guide.

Any of the above embodiments may be refined in by aligning the fabricated sensor device prior to passing the sensor device through the magnetic field so that the long axis of the flux guide is aligned to the component of the magnetic field.

In any of the preceding embodiments, the magnetic field may be produced by a stationary magnet.

Any of the preceding embodiments may be refined so that the passing comprises directing a moveable member of the handler apparatus to pass through the magnetic field produced by the stationary magnet.

In any of the preceding embodiments, the magnetic field may be produced by an electromagnet, and the method may further comprise activating the electromagnet as the sensor device approaches to thereby apply the magnetic field.

In any of the preceding embodiments, the magnetic field may be produced by a magnetic yoke assembly comprising a single magnet.

In any of the preceding embodiments, the magnetic field may be produced by a magnetic yoke assembly comprising two permanent magnets.

In any of the preceding embodiments, the magnitude of the component may exceed about 75 Gauss.

In any of the preceding embodiments, the magnitude of the component may exceed about 100 Gauss.

Other embodiments provide a handler system for processing sensing devices, each sensing device comprising a magnetic sensing element and a flux guide aligned to direct magnetic flux toward the magnetic sensing element. The handler system suitably comprises a supply source configured to receive the sensing devices after fabrication of the sensing devices, a movable member configured to obtain the sensing devices from the supply source and to move the sensing devices along a path from the supply source toward at least one test station, and a magnetic field source located proximate to the path of the sensing devices and configured to apply a magnetic field to the sensing devices as the moveable member moves the sensing devices toward the at least one test station.

The handler system may further comprise an alignment feature configured to align the sensing devices prior to the sensing devices passing through the magnetic field so that at least a component of the magnetic field is aligned along a long axis of the flux guide.

The handler system may also comprise a machine vision system configured to recognize orientations of the sensing devices and to adjust orientations of the sensing devices through actuation of the moveable member.

In any of the preceding handler systems, the magnetic field source may comprise a magnetic yoke, the magnetic yoke comprising a crosspiece member having opposing ends and two permanent magnets each located at one of the opposing ends of the crosspiece member to thereby apply the magnetic field as the sensing devices pass between the two permanent magnets of the magnetic yoke.

In any of the preceding handler systems, the magnetic field source may comprise a yoke, the yoke comprising a single magnet and a region proximate the single magnet that is configured to receive the sensing devices during application of the magnetic field.

Any of the preceding handler systems may additionally comprise a magnetic shield between the magnetic field source and the at least one test station.

Still other embodiments provide a single magnet, dual magnet or other multi-magnet yoke apparatus for providing a magnetic field to a sensing device comprising a magnetic sensing element and a flux guide having a long axis aligned to direct magnetic flux toward the magnetic sensing element. The magnetic yoke apparatus suitably comprises a crosspiece member comprising a region configured to accept the sensing device and one, two or more magnets disposed on the crosspiece member to thereby produce a magnetic field in the region configured to accept the sensing device. The magnetic field is suitably configured to be applied along the long axis of the sensing device as the sensing device is placed in the region configured to accept the sensing device.

The magnetic yoke apparatus may further comprise a second magnet, wherein the crosspiece member is substantially C-shaped so that first and second ends of the crosspiece member face toward each other, and wherein the magnet and the second magnet are located near the first and second ends of the crosspiece member.

Any preceding yoke apparatus may further comprise one or two extender members each located proximate to one of the magnets, wherein the extender members are separated from each other by a gap corresponding to the region configured to accept the sensing device, and wherein the gap allows the sensing device to pass therethrough.

Any preceding yoke apparatus may further comprise a mount coupled to the crosspiece member, wherein the mount is configured to couple the yoke to a handler system so that the yoke remains stationary with respect to the handler system, and wherein the handler system aligns the sensing device and moves the sensing device through the gap separating the two extender members to thereby apply the magnetic field to the long axis of the sensing device.

While at least one exemplary embodiment has been presented in the foregoing detailed description, it should be appreciated that a vast number of equivalent variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A method executable by a handler apparatus to process a fabricated sensor device that comprises a magnetic sensing element and a flux guide aligned to direct magnetic flux toward the magnetic sensing element, the method comprising:
   passing the fabricated sensor device through an externally applied magnetic field applied by an external magnetic field source that is outside of the fabricated sensor device by the handler apparatus, the externally applied magnetic field having a component aligned along a long axis of the flux guide, the component of the externally applied magnetic field having a magnitude along the long axis of the flux guide sufficient to place the flux guide of the fabricated sensor device into a known magnetic state;
   prior to passing the fabricated sensor device through the externally applied magnetic field, the handler apparatus aligning the fabricated sensor device to the externally applied magnetic field so that the long axis of the flux guide is aligned to the component of the externally applied magnetic field while the fabricated sensor device passes through the externally applied magnetic field to thereby magnetically pre-condition the fabricated sensor device prior to testing and operation of the fabricated sensor device; and
   after passing the fabricated sensor device through the externally applied magnetic field, the handler apparatus providing the fabricated and pre-conditioned sensor device for subsequent testing and operation of the fabricated sensor device.

2. The method of claim 1 wherein the component of the externally applied magnetic field magnetically preconditions the fabricated sensor device by making alignment of magnetic domains uniform along substantially an entirety of the long axis of the flux guide, thereby placing the flux guide into a known magnetic state.

3. The method of claim 1 wherein the external magnetic field source that applies the externally applied magnetic field is a stationary magnet.

4. The method of claim 3 wherein the passing comprises directing a moveable member of the handler apparatus to pass through the externally applied magnetic field produced by the stationary magnet, wherein the fabricated sensor device is coupled to the moveable member.

5. The method of claim 1 wherein the external magnetic field source that applies the externally applied magnetic field is an electromagnet, and wherein the method comprises activating the electromagnet as the fabricated sensor device approaches to thereby apply the externally applied magnetic field.

6. The method of claim 1 wherein the externally applied magnetic field is produced by a magnetic yoke assembly comprising a single magnet.

7. The method of claim 1 wherein the externally applied magnetic field is produced by a magnetic yoke assembly comprising two permanent magnets.

8. The method of claim 1 wherein the magnitude of the component of the externally applied magnetic field exceeds about 75 Gauss.

9. The method of claim 1 wherein the magnitude of the component of the externally applied magnetic field is about 100 Gauss.

10. A handler system for processing sensing devices, each sensing device comprising a magnetic sensing element and a flux guide aligned to direct magnetic flux toward the magnetic sensing element, the handler system comprising:
 a supply source configured to receive the sensing devices after fabrication of the sensing devices;
 a movable member configured to obtain the sensing devices from the supply source, to align the sensing device to an externally-applied magnetic field prior to testing and operation of the sensing device so that at least a component of the externally applied magnetic field is aligned along a long axis of the flux guide, and to move the sensing devices along a path from the supply source toward at least one test station; and
 a magnetic field source external to the sensing devices that is located proximate to the path of the sensing devices to thereby apply the externally applied magnetic field to the aligned sensing devices as the movable member moves the sensing devices along the path toward the at least one test station to thereby magnetically pre-condition the sensing devices prior to testing and operation of the sensing devices.

11. The handler system of claim 10 comprising a machine vision system configured to recognize orientations of the sensing devices and to adjust the orientations of the sensing devices through actuation of the movable member.

12. The handler system of claim 10 wherein the magnetic field source comprises a magnetic yoke, the magnetic yoke comprising a crosspiece member having opposing ends and two permanent magnets each located at one of the opposing ends of the crosspiece member to thereby apply the externally applied magnetic field as the sensing devices pass between the two permanent magnets of the magnetic yoke.

13. The handler system of claim 10 wherein the magnetic field source comprises a yoke, the yoke comprising a single magnet and a region proximate the single magnet that is configured to receive the sensing devices during application of the externally applied magnetic field.

14. The handler system of claim 10 further comprising a magnetic shield between the magnetic field source and the at least one test station.

15. A magnetic yoke apparatus for providing a magnetic field to a sensing device that comprises a magnetic sensing element and a flux guide having a long axis aligned to direct magnetic flux toward the magnetic sensing element, the magnetic yoke apparatus comprising:
 a crosspiece member comprising a region configured to accept the sensing device; and
 a magnet disposed on the crosspiece member to thereby produce an externally applied magnetic field in the region configured to accept the sensing device, wherein the magnet is external to the sensing device and is configured to apply the externally applied magnetic field as an externally-applied field that is aligned along the long axis of the sensing device as the sensing device is placed in the region configured to accept the sensing device and to thereby magnetically pre-condition the sensing device prior to testing and operation of the sensing device.

16. The magnetic yoke apparatus of claim 15 further comprising a second magnet, wherein the crosspiece member is substantially C-shaped so that first and second ends of the crosspiece member face toward each other, and wherein the magnet and the second magnet are located near the first and second ends of the crosspiece member.

17. The magnetic yoke apparatus of claim 16 further comprising two extender members each located proximate to one of the magnets, wherein the two extender members are separated from each other by a gap corresponding to the region configured to accept the sensing device, and wherein the gap allows the sensing device to pass therethrough.

18. The magnetic yoke apparatus of claim 17 further comprising a mount coupled to the crosspiece member, wherein the mount is configured to couple the magnetic yoke apparatus to a handler system so that the magnetic yoke apparatus remains stationary with respect to the handler system, and wherein the handler system aligns the sensing device and moves the sensing device through the gap separating the two extender members to thereby apply the magnetic field to the long axis of the sensing device.

* * * * *